United States Patent [19]

Hino

[11] Patent Number: 4,654,597
[45] Date of Patent: Mar. 31, 1987

[54] MAGNETIC RESONANCE IMAGING SIGNAL GENERATING SYSTEM

[75] Inventor: Masaaki Hino, Otawara, Japan

[73] Assignee: Kabushiki Kaisha Toshiba, Kawasaki, Japan

[21] Appl. No.: 744,268

[22] Filed: Jun. 13, 1985

[30] Foreign Application Priority Data

Jun. 13, 1984 [JP] Japan .................................. 59-121506

[51] Int. Cl.$^4$ ............................................ G01R 33/20
[52] U.S. Cl. .................................... 324/322; 324/314; 328/15
[58] Field of Search ................. 364/413, 414; 324/307, 324/309, 312, 314, 322; 328/15, 23; 307/262, 271, 529

[56] References Cited

U.S. PATENT DOCUMENTS 3,983,495 9/1976 Epstein ................................. 307/262
4,165,479 8/1979 Mansfield ............................ 324/309
4,303,837 12/1981 Ansaldi et al. ..................... 307/262

*Primary Examiner*—Stewart J. Levy
*Assistant Examiner*—Kevin D. O'Shea
*Attorney, Agent, or Firm*—Finnegan, Henderson, Farabow, Garrett & Dunner

[57] ABSTRACT

A magnetic resonance imaging signal generating system for controlling the frequency and phase of a high frequency signal capable of use in connection with rotating specific atomic nuclei and/or demodulating resultant magnetic resonance signals. The system includes a memory for storing digital signals which collectively represent the waveform of an analog signal and a mechanism for reading those digital signals from the memory by accessing addresses of the memory at a rate responsive to a frequency control signal to produce a series of digital signals which represent the analog signal having an angular frequency which is a function of the frequency control signal. An offset circuit is provided for offsetting the addresses of the memory means accessed by the reading mechanism in response to the phase control signal. The output of the memory means is used to efficiently and effectively alter the phase and angular frequency of that high frequency signal.

6 Claims, 6 Drawing Figures

MAGNETIC RESONANCE IMAGING SIGNAL GENERATING SYSTEM

BACKGROUND OF THE INVENTION

1 Field of the Invention

This invention relates to a magnetic resonance imaging signal generating system which, in response to frequency and phase control signals, provides first and second high frequency signals, one of which may be used to generate a magnetic field for rotating specific atomic nuclei and the other of which may be used for demodulating resultant magnetic resonant signals.

2 Background Information

A magnetic resonance imaging apparatus has the capacity of subjecting specific atomic nuclei in an object such as an living body to a magnetic resonance phenomena. This magnetic resonance phenomena results in the production of data relating to the spin density distribution and/or the relaxation time constant distribution of specific atomic nuclei within the object.

More particularly, in known prior art magnetic resonance imaging apparatus such as that disclosed in FIG. 1, an object 1 under observation is positioned within a composite magnetic field generated by both a static magnetic field generation coil and a gradient magnetic field generation coil, not shown in FIG. 1. After object 1 has been subjected to the requisite composite magnetic field, object 1 is thereafter subject to a high frequency excitation pulse which has a frequency corresponding to the resonant frequency of specific atomic nuclei within object 1. As shown in FIG. 1, this high frequency excitation pulse is represented by pulse signal $f_0$. Pulse signal $f_0$ is delivered to a head probe 2 which is disposed around object 1. A transmitter 3 is employed to generate pulse signal $f_0$ in a manner well known to those skill in the magnetic resonance imaging art.

After high frequency pulse signal $f_0$ supplied by transmitter 3 is delivered into probe head 2, a high frequency magnetic field results to create a magnetic resonance phenomena within object 1. This phenomena results in a generation of magnetic resonance imaging signals which are delivered from head probe 2 to a receiver 4, the output of which is transmitted to an amplifier 5 and then to a demodulator 6. The amplified signals are demodulated by demodulator 6 and delivered to a signal processor 7 in which the spin density distribution of the excited atomic nuclei, the relaxation time constant distribution of the excited atomic nuclei or the like are calculated for display.

The operation of transmitter 3 is governed in accordance with a first high frequency signal $fr_1$ and the operation of demodulator 6 is governed in accordance with a second high frequency signal $fr_2$. Signals $fr_1$ and $fr_2$ are generated by a signal generating device 8. The frequencies of both first and second high frequency signals $fr_1$ and $fr_2$ generally correspond to the resonant frequency of the atomic nuclei to be excited, typically the hydrogen atomic nuclei, within object 1. Accordinqly, the anqular frequency of high frequency signals $fr_1$ and $fr_2$ generally corresponds to the angular frequency $W_o$ determined in accordance with the well known Bohr's relationship:

$$W_o = \gamma H_0$$

wherein:

$H_0$ = the intensity of the static magnetic field to which object 1 is subjected; and $\gamma$ = the gyromagnetic ratio for the atomic nuclei under observation.

Since the resonant angular frequency $W_o$ of the hydrogen nuclei within object 1 is a function of the intensity of the static magnetic field and since the static magnetic field includes a gradient component, various slices of object 1 may be observed through frequency variation of first and/or second high frequency signals $fr_1$ and $fr_2$. For any given relation between the frequency of first signal $fr_1$ and second signal $fr_2$, a particular slice of object 1 may be observed.

In order to shorten acquisition time, a multi-slice method may be utilized in which the frequency of either the first or second high frequency signals $fr_1$ and $fr_2$ is offset by an amount $\Delta f$. In the alternative, a two-dimensional Fourier transforming method may be employed in which phase information is utilized as a significant detecting factor. In such signal acquisition processes, precise phase differentials $\Delta \theta$ must be generated.

More specifically, if a magnetic resonance signal detected by receiver 4 has a resonant angular frequency $W_o$ and is demodulated by demodulator 6 using a standard second high frequency signal $fr_2$ having an angular frequency $W_r$, the resultant demodulated signal $V_f$ is represented by the following equation:

$$V_f \alpha m_o(x,y,z) \cdot \exp^{-(1/T_2^* + j\Delta\theta)}$$

wherein:

$m_o(x,y,z)$ = the density of hydrogen atomic nuclei at a particular coordinate (x,y,z);

$T_2^*$ = the spin-spin relaxation time of atomic nuclei influenced by the non-uniformity of the magnetic field; and $\Delta\theta$ = the absolute value of phase differential between the angular frequency $W_o$ of the detected magnetic resonance signal and the angular frequency $W_r$ of the second high frequency signal $fr_2$ used in connection with demodulator 6, so that $\Delta\theta = |(W_o - W_r)|$.

It is critical that the phase differential between the received magnetic resonance signal and the demodulating signal be adjusted as precisely as possible in order to maximize the precision of the resulting image information. The phase differential $\Delta\theta$ may be achieved by supplying the received magnetic resonance signals into delay lines which are comprised of inductance and capacitance circuits. However, some problems have existed in adjusting such circuits to the precision required and to assure that such delay lines are in an analog method. Moreover, if the intensity of the static magnetic field $H_0$ is increased in order to increase the performance of the magnetic resonance apparatus, the resonant frequency (lamor frequency) $f_o$ increases in proportion to the magnetic field intensity. Under these conditions, limitations appear in the capacity to correspondingly adjust the performance of the delay lines.

Furthermore, even if accurate control of the delay lines is feasible, the delay lines result in an increase in the size and cost of the resultant magnetic resonant imaging apparatus. Moreover, even if control of the phase differentials may be obtained through utilization of delay lines, when the resonant frequency changes with time as in the multi-slice method, it has been found almost impossible to perform the necessary phase adjustment with the requisite high degree of precision in the wake of these frequency changes.

It is, therefore, an object of the subject invention to provide a magnetic resonance imaging signal generating system which permits magnetic resonance signals to be measured with a high degree of precision by readily and precisely controlling the phase differential of the high frequency signals which are utilized to generate the magnetic resonance phenomena and/or signal demodulation of a magnetic resonance signal.

Additional objects and advantages of the invention will be set forth in part in the description which follows and in part will be obvious from the description or learned by practice of the invention.

SUMMARY OF THE INVENTION

To achieve the foregoing objects, and in accordance with the purposes of the invention as embodied and broadly described herein, a magnetic imaging signal generating system is provided for producing, in response to frequency and phase control signals, at least one frequency and phase controllable high frequency signal for use in rotating specific atomic nuclei or for use in demodulating resultant magnetic resonance signals, this system including a mechanism for precisely controlling the frequency and phase of either one or both of these first and second high frequency signals through the employment of an oscillator to produce a reference high frequency signal; memory means for storing digital signals which collectively represent the waveform of an analog signal; reading means for reading the digital signals from the memory means by accessing addresses of the memory means at a rate responsive to the frequency control signal to produce a series of digital signals which represent the angular signal having an angular frequency which is a function of the frequency control signal; offsetting means for offsetting the addresses of the memory means accessible by the reading means in response to the phase control signal; and means responsive to the digital signals for altering the angular frequency and phase of the reference high frequency signal to produce at least one frequency and phase controllable high frequency frequency signal.

In more limiting terms, the magnetic resonance imaging signal generating system of the subject invention is responsive to digital frequency and phase control signals and comprises an oscillator to produce the reference high frequency signal; a digital-to-analog converter for converting the digital frequency control signal to an analog frequency control signal having an amplitude which is proportional to the value of the digital frequency control signal; an analog-to-frequency converter for converting the analog frequency control signal to a frequency frequency control signal having a frequency which is proportional to the amplitude of the analog frequency control signal; first and second counters, each of which are controlled by the frequency frequency control signal; means for offsetting the output of the counters an amount represented by the phase control signal; first and second memory means for storing digital signals which represent the waveform of an analog signal, the first and second memory means having addresses connected to the output of the first and second counters, respectively, to read out the stored digital signal at a rate responsive to the output of those counters to produce first and second series of digital signals from the first and second memory means which represent first and second analog signals 90 degrees out of phase with one another, with those first and second analog signals having an angular frequency which is a function of the digital frequency control signal; means for converting the first and second series of digital signals into the first and second analog signals having the angular frequency determined by the digital frequency control signal; and means responsive to the first and second analog signals to alter the angular frequency and phase of the first high frequency signal to produce at least one frequency and phase controllable high frequency signal.

Still further, the magnetic resonance imaging signal generating system of the subject invention preferably also includes means for shifting the phase of the first high frequency signal 90 degrees to produce a second reference high frequency signal; first and second double balanced mixers for mixing the first reference high frequency signal and the first analog signal and for mixing the second reference high frequency signal and the second analog signal to produce first and second mixed signals, respectively; and means for adding the first and second mixed signals together to produce the second high frequency signal.

DESCRIPTION OF THE PREFERRED EMBODIMENT

Figure 1:
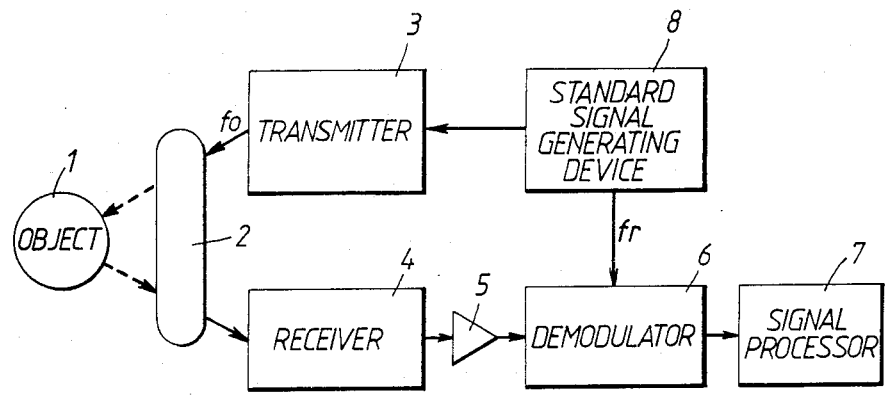
FIG. 1 is a schematic block diagram illustrating a prior art magnetic resonance imaging system.

FIG. 1 is a prior art magnetic resonance imaging system which employs a standard signal generating device 8 for use in providing first and second high frequency signals for operation of transmitter 3 and demodulator 6.

Figure 2:
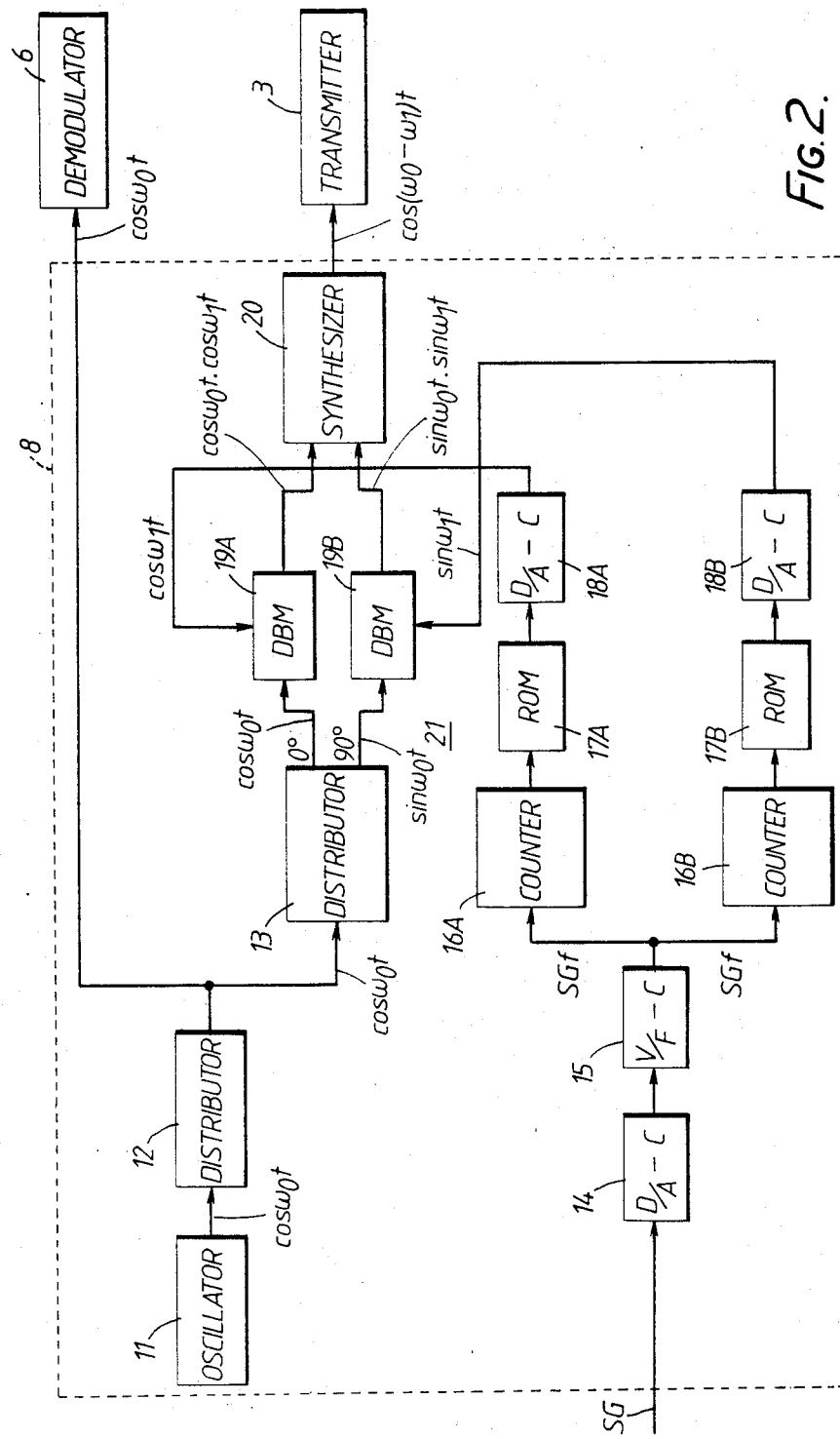
FIG. 2 is a schematic block diagram of a magnetic resonance imaging signal generating system incorporating the teachings of the subject invention.

In FIG. 2 there is illustrated a magnetic resonance imaging signal generating system 10 which is built in accordance with the teachings of the subject invention to provide a reference high frequency signal $\cos w_0 t$ and a first frequency and phase controllable high frequency signal $\cos ((w_o - w_1)t + \Delta\theta)$ which may be used in connection with operation of a transmitter 3 or a demodulator 6 of FIG. 1, it being understood that either signal may be utilized with either transmitter 3 or demodulator 6.

As shown in FIG. 2, system 10 comprises an oscillator 11, a distributor 12, a distributor 13, a digital-to-analog converter 14, a voltage-to-frequency converter 15, counters 16A and 16B, read only memories 17A and 17B, digital-to-analog converters 18A and 18B, double balanced modulators 19A and 19B, and synthesizer 20.

Oscillator 11 comprises, for example, a piezocrystal element and is capable of issuing forward a high frequency oscillation signal $\cos w_0 t$ which is of sufficiently high frequency so as to be used for generating a magentic field through operation of transmitter 3 capable of rotating specific atomic nuclei in an object under observation or for demodulating the resultant magnetic resonant signal through operation of demodulator 6. It should be understood that the term "for use" in connection with the description of the output of oscillator 11 does not specifically require a direct utilization of the output signal of oscillator 11 in demodulator 6 and/or transmitter 3, but rather contemplates that an alteration or modification of the output of oscillator 11 may be undertaken prior to utilization by transmitter 3 or demodulator 6.

As shown in FIG. 2, the output of cos $W_o t$ from oscillator 11 is delivered to the input of distributor 12 which, after buffering, operates to apply this same signal cos $W_o t$ both to demodulator 6 in connection with operation of receiving and demodulating magnetic resonance imaging signals and to distributor 13 in connection with the operation of transmitter 3 and, therefore, the production of magnetic fields capable of producing magnetic resonance phenomena within the object under observation.

Distributor 13 operates to output two reference signals, cos $W_o t$ and sin $W_o t$ which are 90 degrees out of phase from one another. These two signals are delivered to respective double balance mixers 19A and B whose operation will be described below.

The magnetic resonance imaging signal generating system 10 of FIG. 2 contemplates the receipt of a frequency control signal F which preferably is digital in nature; a phase control signal P which also is preferably digital in nature; and a clock signal Cr which is also preferably digital in nature. The value of digital frequency control signal F represents the amount of frequency differentiation from the angular frequency $w_0$ of the output signal from oscillator 11 required for use in connection with the operation of transmitter 3. Phase control signal P represents a phase differential $\Delta\theta$ required for proper operation of transmitter 3. Clock signal Cr provides appropriate operation of counters 16A and B as will be explained below.

Digital-to-analog converter 14 receives digital control signal F which represents the amount of angular frequency variation required from $w_0$ as a result of the specific resonant frequency of the atomic nuclei under observation and as a result of the intensity of static magnetic field $H_o$ so as to generate a magnetic resonance phenomena from those atomic nuclei in the object under observation. Digital-to-analog converter 14 converts this digital frequency control signal F to an analog voltage frequency control signal. This analog voltage frequency control signal is supplied to voltage-to-frequency converter 15 which converts the analog voltage frequency control signal to a frequency frequency control signal $F_f$. Control signal $F_f$ accordingly has a frequency which is directly proportional to the value of the original digital frequency control signal F. Control signal $F_f$ is used to operate counters 16A and B.

Figure 4:
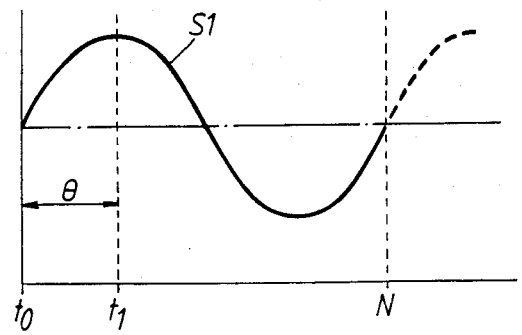
FIG. 4 is a wave chart for explaining the operation of the circuit of FIG. 2.
Figure 4:
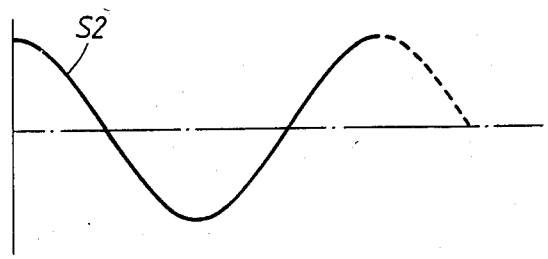

Counters 16A and B have their output coupled to read only memory 17A and B respectively. Each of memories 16A and B have stored therein digital signals which collectively represent the waveform of an analog signal. Specifically, the digital signals stored in read only memory 17A represent the waveform of a signal $S_1$ which, as shown in FIG. 4(a), has the form of sin $w_1 t$. The angular frequency $w_1$ of waveform $S_1$ is a function of the number of addresses of memory 17A in which waveform $S_1$ is stored and a function of the rate at which the data in each of those addresses is sequentially read out. Thus, the angular frequency $w_1$ of waveform $S_1$ may be altered either by altering the data stored within memory 17A or by altering the rate at which that data is read out.

In a similar manner, digital signals are stored in memory 17B which collectively represent the waveform $S_2$ of an analog signal as shown in FIG. 4(b). The data stored in memory 17B is identical to that stored in 17A except that the data is shifted 90 degrees so that while waveform $S_1$ is in the form sin $w_1 t$, waveform $S_2$ is in the form cos $w_1 t$.

Counters 16A and B operate to read out the data stored in memories 17A and 17B, respectively. Accordingly, the rate at which data is read out from memories 17A and B is a direct function of the value of digital control signal F. The resultant series of digital signals which are read out from memories 17A and B therefore represent analog signals having waveforms $S_1$ and $S_2$, respectively having an angular frequency $W_1$ which are a function of the value of digital frequency control signal F, and having a 90 degrees phase shift one from the other.

The series of digital signals read out from memories 17A and B are coupled to digital-to-analog converters 18A and 18B, respectively. Digital-to-analog converters 18A and 18B convert those series of digital signals into respective first and second analog signals having wave shapes $S_1$ and $S_2$, respectively; having angular frequency $w_1$ determined by the value of digital frequency control signal F, and shifted in phase 90 degrees one from the other.

In addition to receiving frequency frequency control signal $F_f$, counter 16A also receive phase control signal P. Phase control signal P is employed to load counters 16A and B with a preset count which, as will be explained in more detail below, results in a fixed phase shift of first and second analog signals outputted from digital-to-analog converters 18A and 18B, respectively. The value of phase control signal P dictates the value of this phase shift $\Delta\theta$.

Figure 3:
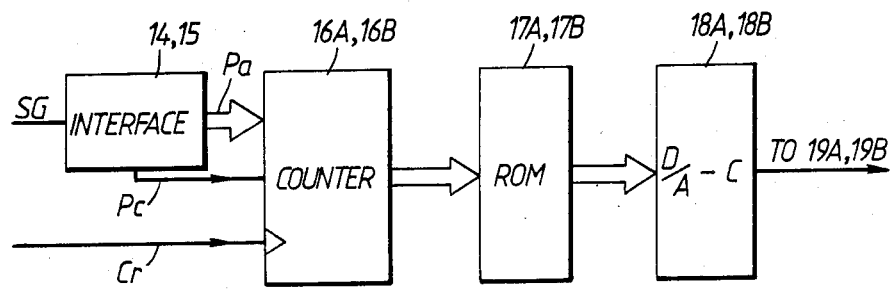
FIG. 3 is a block diagram showing the counters of FIG. 2 in more detail.

An illustrative example of counters 16A and 16B is shown in FIG. 3. In FIG. 3 counters 16A, 16B are shown to comprise a register 22, a zero point counter 24, and an adder 26. Register 22 receives the digital phase control signal P and outputs that signal in binary format to adder 26. Zero point counter 24 receives as an input frequency frequency control signal $F_f$. Zero point counter 24 operates to produce a binary output to adder 26 which is a direct function of the frequency of signal $F_f$. Adder 26 operates to add together the outputs of register 22 and zero point counter 24 to provide a binary address signal to memory 17A, 17B. Clock pulse Cr is coupled to gate the output of adder 26 and thereby determine when the output of counters 16A, 16B are delivered to memories 17A, 17B.

Thus, counters 16A and 16B may be preloaded by a fixed count determined by the value of phase control signal P. Thereafter, the value of the output of counters 16A and B is determined by the frequency of signal $F_f$ which, in turn, is controlled by the magnitude of digital frequency control signal F. Counters 16A and 16B, therefore, cycle at a speed determined by the magnitude of frequency control signal F with the output of counters 16A and 16B being used to access the digital $S_1$ and $S_2$ waveform data stored in memories 17A and 17B. At any time, the preloaded value of counters 16A and 16B may be altered by altering the value of phase control signal P, thereby altering the phase shift $\Delta\theta$ of the first and second analog signals outputted from digital-to-analog converters 18A, 18B.

Double balanced mixers 19A and 19B compound the high frequency outputs $\cos w_o t$ and $\sin w_o t$ from distributor 13 with the substantially lower frequency first and second analog signals $\sin(w_1 t + \Delta\theta)$ and $\cos(w_1 t + \Delta\theta)$ from digital-to-analog converters 18A and 18B, respectively. Mixer 19A receives the signals $\cos w_o t$ and $\cos(w_1 t + \Delta\theta)$ for the compound procedure to issue a signal $\cos w_o t \cdot \cos(w_1 t + \Delta\theta)$. Mixer 19B receives signals $\sin w_o t$ and $\sin(w_1 t + \Delta\theta)$ for the compound procedure to issue forth a signal $\sin(w_o t) \cdot \sin(w_1 t + \Delta\theta)$.

Synthesizer 20 adds the signals $\cos(w_o t) \cdot \cos(w_1 t + \Delta\theta)$ and $\sin(w_o t) \cdot \sin(w_1 t + \Delta\theta)$ to issue forth a resultant high frequency output signal $\cos((w_o - w_1)t + \Delta\theta)$. Specifically:

$$\cos(w_0 t) \cdot \cos(w_1 t + \Delta\theta) + \sin(w_0 t) \cdot \sin(w_1 t + \Delta\theta) =$$

$$\tfrac{1}{2}[\cos(w_0 t + w_1 t + \Delta\theta) + \cos(w_0 t - w_1 t - \Delta\theta)] +$$

$$\tfrac{1}{2}[\cos(w_0 t - w_1 t - \Delta\theta) - \cos(w_0 t + w_1 t + \Delta\theta)] =$$

$$\cos(w_0 t - w_1 t - \Delta\theta) = \cos((w_0 - w_1)t - \Delta\theta)$$

The operation of the magnetic resonance imaging signal generating system 10 of the subect invention will now be reviewed. Since signals of the desired offset frequency $w_o$ may be read out from read only memories 17A and 17B by simply controlling the specific count speeds of counters 16A and 16B through control of digital frequency control signal F, the output frequency of oscillator 11 and, hence, the frequency of a high frequency signal outputted from system 10 can be easily altered. Although the output frequency of system 10 is an extremely high frequency signal, this alteration can occur through control of the relatively low angular frequency of the output signals from memory 17A and 17B, not by direct control of oscillator 11. Thus effective alteration of the output frequency of oscillator 11 can be easily and precisely accomplished.

In addition, since the data in memory 17A and 17B is read out as a function of the output of counters 16A and 16B, respectively, and since these counters are provided with a preloading function, an absolute phase shift $\Delta\theta$ can be obtained in the resulting output signal from system 10. The value of this phase shift $\theta$ can be easily controlled by simply changing the value of phase control signal P and thereby changing the preloading count of counters 16A and 16B. Accordingly, without changing the operation of oscillator 11, it is possible to easily and effectively change the phase of the output from oscillator 11 even though oscillator 11 operates in an extensive high frequency region, through simple utilization of the data stored in memories 17A and 17B and through simple control of the preloading function of counters 16A and 16B.

The precision of this phase control is considerable. Specifically, when the data stored in memories 17A and 17B is in the form of waveforms S1 and S2 as shown in FIGS. 4(a) and 4(b), and the counters 16A and 16B are initiated at a time $t_o = 0$, there is in effect no preloading function. On the other hand, when counters 16A and 16B are initiated with a preloaded value so as to start at the desired time $t_1$, a waveform having a phase shift $\Delta\theta$ in comparison to waveform $S_1$ is produced.

Assuming that N addresses are used in memories 17A and 17B to store one cycle, and assuming that memories 17A and 17B can be accessed in increments of one address, the minimum phase variable amount $\Delta\theta_m$ is represented by the following formula:

$$\Delta\theta_m = 360/N.$$

For example, if N equals 1,024, the amount $\Delta\theta_m$ is approximately 0.35 degrees. Thus, a phase control of precision less than 1 degree can be achieved using the teachings of the subject invention. Of course, clock signals Cr transmitted to counters 16A and 16B must be in a stable condition in order to maximize the precision of the phase control.

From the foregoing, it should be understood that the data stored in memories 17A and 17B may be identical, and the requisite 90 degree phase shift between the output of memories 17A and 17B may be accomplished by simply preloading counter 16B by a count equivalent to one quarter cycle.

According to the invention as described above, it is possible to phase control the high frequency output signal from a standard high frequency oscillator 11 in a stable and precise manner by simply controlling the phase of low frequency output signals from memories 17A and 17B without directly controlling the phase operation of oscillator 11 itself. As a consequence, the apparatus of the subject invention has particular utility in setting the phase and frequency in the high frequency operation regions required in a magnetic resonance imaging apparatus. Furthermore, the subject invention provides an efficient mechanism for changing resonance frequency which is required in the multi-slice method of magnetic resonance imaging.

Figure 5:
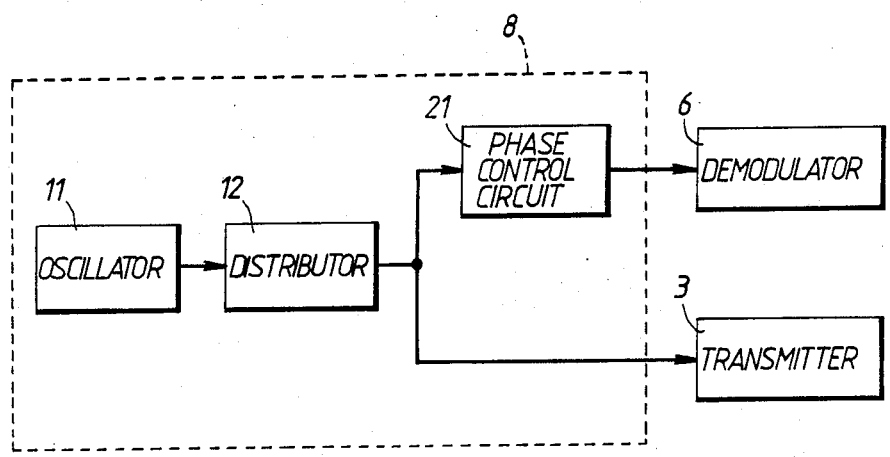
FIGS. 5 and 6 are schematic block diagrams illustrating different alternative embodiments of the utilization of a magnetic resonance imaging signal generating system built in accordance with the teachings of the subject invention.
Figure 6:
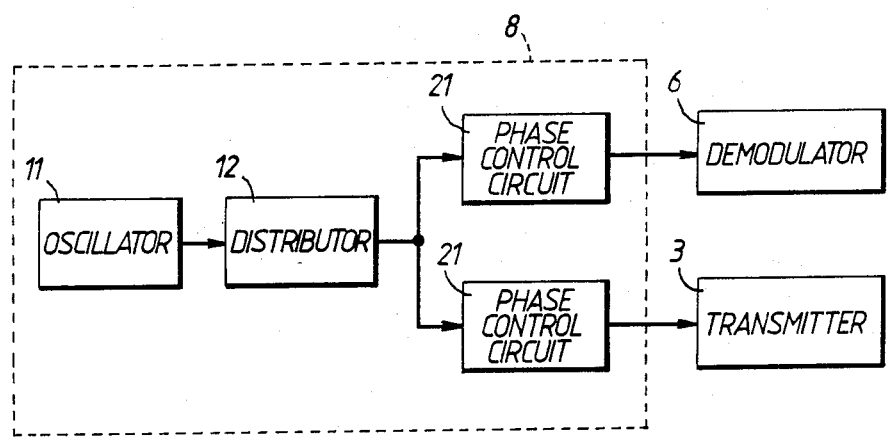

As should be apparent to those skilled in the art, modification and variations may be made in the above-described embodiment without departing from the spirit or scope of this invention. For example, a phase control circuit 21 of FIG. 2 comprising distributor 13, digital-to-analog converter 14, voltage-to-frequency converter 15, counters 16A and 16B, memories 17A and 17B, digitial-to-analog converters 18A and 18B, double balanced mixers 19A and 19B and synthesizer 20, does not necessarily need to be utilized in connection with the operation of transmitter 3. Instead, phase control circuit 21 may be employed in connection with operation of demodulator 6 as shown in FIG. 5. Moreover, it is certainly within the contemplation of the subject invention to employ phase control circuits 21 in connection with both transmitter 3 and demodulator 6 as shown in FIG. 6.

I claim:

1. A magnetic resonance imaging signal generating system for producing, in response to frequency and phase control signals, at least one frequency and phase controllable high frequency signal for use in developing magnetic resonance signals, said system comprising:
   (a) an oscillator to produce a reference high frequency signal;
   (b) memory means for storing digital signals which collectively represent the waveform of an analog signal;
   (c) means for reading said digital signals from said memory means by accessing addresses of said memory means at a rate responsive to said frequency control signal to produce a series of digital signals which represent said analog signal having an angular frequency which is a function of said frequency control signal;

(d) offset means for offsetting the addresses of said memory means accessed by said reading means in response to said phase control signal; and (e) means, responsive to said digital signals, for altering the angular frequency and phase of said reference high frequency signal to produce at least one of said frequency and phase controllable high frequency signals.

2. The system of claim 1 including:

(a) second memory means for storing digital signals which collectively represent the waveform of an analog signal;

(b) second reading means for reading said digital signals from said memory means by accessing addresses of said memory means at a rate responsive to said frequency control signal to produce a series of digital signals which represent said analog signal having an angular frequency which is a function of said frequency control signal;

(c) second offset means for offsetting the addresses of said second memory means accessed by said second reading means in response to said phase control signal; and (d) means, responsive to said second digital signals, to alter the angular frequency and phase of said reference high frequency signal to produce a second frequency and phase controllable high frequency signal.

3. The system of claim 1 wherein said means for reading includes a counter whose rate of counting is a function of said frequency control signal.

4. The system of claim 3 wherein said offset means includes means for offsetting the output of said counter as a function of said phase control signal.

5. A magnetic resonance imaging signal generating system for producing, in response to digital frequency and phase control signals, at least one frequency and phase controllable high frequency signal for use in developing magnetic resonance signals, said system comprising:

(a) an oscillator to produce a first reference high frequency signal;

(b) a digital-to analog converter for converting said digital frequency control signal to an analog frequency control signal having an amplitude which is proportional to the value of said digital frequency control signal;

(c) an analog to-frequency converter for converting said analog frequency control signal to a frequency frequency control signal having a frequency which is proportional to the amplitude of said analog frequency control signal;

(d) first and second counters, each of which are controlled by said frequency frequency control signal;

(e) means for offsetting the output of said counters an amount represented by said phase control signal;

(f) first and second memory means for each storing digital signals which collectively represent the waveform of an analog signal, said memory means having addresses coupled to the output of said counters to permit said counters to read out said stored digital signals from said memory means at a rate responsive to the output of said counters to thereby produce first and second series of digital signals from said first and second memory means which represent first and second analog signals that are 90 degrees out of phase with one another and that each have an angular frequency which is a function of said digital frequency control signal;

(g) means for converting said first and second series of digital signals into first and second analog signals; and (h) means responsive to said first and second analog signals for altering the angular frequency and phase of said first reference high frequency signal to produce at least one of said frequency and phase controllable high frequency signals.

6. The system of claim 5 wherein said means for altering comprises:

(a) means for shifting the phase of said first reference high frequency signal 90 degrees to produce a second reference high frequency signal;

(b) first and second double balance mixers for mixing said first reference high frequency signal and said first analog signal and for mixing said second reference high frequency signal and said second analog signal to produce first and second mixed signals, respectively; and (c) means for adding said first and second mixed signals together to produce said at least one frequency and phase controllable high frequency signal.

* * * * *